United States Patent
Ishikawa et al.

(10) Patent No.: US 9,128,163 B2
(45) Date of Patent: Sep. 8, 2015

(54) VOLTAGE MEASURING APPARATUS FOR PLURAL BATTERY

(75) Inventors: Satoshi Ishikawa, Makinohara (JP); Masashi Sekizaki, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 349 days.

(21) Appl. No.: 13/878,577

(22) PCT Filed: Oct. 12, 2011

(86) PCT No.: PCT/JP2011/073369
§ 371 (c)(1), (2), (4) Date: Apr. 10, 2013

(87) PCT Pub. No.: WO2012/050100
PCT Pub. Date: Apr. 19, 2012

(65) Prior Publication Data
US 2013/0187660 A1    Jul. 25, 2013

(30) Foreign Application Priority Data
Oct. 14, 2010    (JP) .................................. 2010-231210

(51) Int. Cl.
| | |
|---|---|
| *H01M 10/46* | (2006.01) |
| *G01R 31/36* | (2006.01) |
| *G01R 19/165* | (2006.01) |
| *G01R 35/00* | (2006.01) |

(52) U.S. Cl.
CPC .......... *G01R 31/362* (2013.01); *G01R 31/3658* (2013.01); *G01R 19/16542* (2013.01); *G01R 35/00* (2013.01)

(58) Field of Classification Search
USPC ......... 320/107, 116, 118, 119, 132, 149, 150, 320/153
See application file for complete search history.

(56) References Cited

U.S. PATENT DOCUMENTS

2005/0242775 A1*  11/2005  Miyazaki et al. ............. 320/116
2006/0273802 A1  12/2006  Murakami et al.
2010/0225327 A1   9/2010  Ishikawa et al.

FOREIGN PATENT DOCUMENTS

| CN | 1474493 A | 2/2004 |
|---|---|---|
| CN | 1773767 A | 5/2006 |

(Continued)

OTHER PUBLICATIONS

Japanese office action letter issued on Apr. 7, 2015 in the counterpart Japanese patent application.

(Continued)

*Primary Examiner* — Edward Tso
(74) *Attorney, Agent, or Firm* — Marvin A. Motsenbocker; Mots Law, PLLC

(57) ABSTRACT

In a voltage measuring apparatus for a plural battery according to the present invention, each of voltage detecting ICs (21-1) to (21-5) connects a switch SW1 to a reference voltage generator 24 and supplies a reference voltage Vf from the reference voltage generator 24 to an A/D converter 26. The A/D converter 26 digitizes the reference voltage Vf, which is transmitted to a main microcomputer 33. The main microcomputer 33 finds a theoretical value of the reference voltage according to an ambient temperature, compares the theoretical value with the measured value of the reference voltage Vf, and determines whether or not the voltage detecting accuracy of the first voltage detecting IC (21-1) is good.

6 Claims, 5 Drawing Sheets

(56) References Cited

FOREIGN PATENT DOCUMENTS

| | | |
|---|---|---|
| JP | 9-84280 A | 3/1997 |
| JP | 2000-162251 A | 6/2000 |
| JP | 2005-62028 A | 3/2005 |
| JP | 2010-57292 A | 3/2010 |
| JP | 2010-203958 A | 9/2010 |
| JP | 2010-210391 A | 9/2010 |

OTHER PUBLICATIONS

Chinese office action issued on Sep. 2, 2014.
Japanese office action letter issued on Sep. 16, 2014.
A copy of the Chinese office action letter issued on May 5, 2015 in the counterpart Chinese patent application.

* cited by examiner

VOLTAGE MEASURING APPARATUS FOR PLURAL BATTERY

TECHNICAL FIELD

The present invention relates to a voltage measuring apparatus for a plural battery, for detecting an output voltage of the plural battery that connects a plurality of unit cells in series to output a required voltage, and particularly, to a technique of detecting a voltage measurement error and improving detection accuracy.

BACKGROUND ART

For example, an electric car, a hybrid vehicle, or the like has a high-voltage battery as a power source for driving a motor. Such a high-voltage battery connects a plurality of unit cells of a secondary battery (rechargeable battery) such as a nickel-hydrogen battery and a lithium battery in series to provide a high voltage.

In the secondary battery, each unit cell is charged with the same power and is discharged at the same power. Accordingly, if the individual unit cells differently deteriorate, the secondary battery will easily get an overcharge or overdischarge state. To prevent the overcharge or overdischarge state of the secondary battery, the charging state of each unit cell must be checked. Previously, a plurality of (for example, 55) unit cells are divided into, for example, five blocks (namely, 11 unit cells per block) and a cell voltage of each unit cell contained in each block is measured in real time with a voltage detecting IC provided for each block, to monitor if the voltage is abnormal.

As to the voltage monitoring, the voltage detecting IC measures voltages of the unit cells (for example, 11 pieces) in the block, converts a detected analog voltage signal into a digital signal with an A/D converter contained in the voltage detecting IC, and transmits the digital signal to a main microcomputer.

Each voltage detecting IC may involve an error in the accuracy of unit cell voltage measurement. The error, if exists, must be detected and calibrated. There are known voltage measurement accuracy calibration methods, such as one disclosed in Japanese Unexamined Patent Application Publication No. 2005-62028. This related art computes an average of unit cell voltages of each block (each voltage detecting IC) and sets the average as a representative value of the block. According to the representative value, the related art detects a detection error in each unit cell voltage, and if the error is large, corrects the error.

SUMMARY OF INVENTION

Problem to be Solved by Invention

The related art mentioned above, however, employs the method of finding a voltage measurement error according to a reference voltage, i.e., an average of unit cell voltages of each block, and therefore, involves a problem that, if the cell voltages of the unit cells contained in the block vary as a whole, the reference voltage itself becomes unreliable for conducting accurate correction.

To solve the problem of the related art, the present invention provides a voltage measuring apparatus for a plural battery, capable of highly accurately calibrating the voltage detection accuracy of each voltage detecting unit.

Means to Solve Problem

According to a technical aspect of the present invention, there is provided a voltage measuring apparatus for a plural battery that connects a plurality of cells in series to output a required voltage. The apparatus measures an output voltage of each of the cells and includes a voltage detecting part provided for each of a plurality of blocks into which the plurality of cells are divided, to detect each cell voltage in the block and a charging state monitoring part to monitor a charging state of each cell voltage according to the cell voltages detected by the voltage detecting parts. Each of the voltage detecting units includes a communication part to transmit and receive data to and from the charging state monitoring part, a reference voltage generating part having a series-connected circuit of a resistor and at least one diode to output a reference voltage that is generated across the diode when a voltage is applied across the series-connected circuit, and an A/D conversion part to digitize an output voltage of each cell and the reference voltage. The communication part transmits the digitized voltage signals to the charging state monitoring part. The charging state monitoring part includes a theoretical value generating part to generate, according to an ambient temperature, a theoretical voltage generating across the diode and an error detecting part to compare the digitized voltage signal of the reference voltage transmitted from the voltage detecting part with the theoretical value, and according to a result of the comparison, detect an error in the voltage signals digitized by the A/D conversion part.

MODE OF IMPLEMENTING INVENTION

Figure 1:
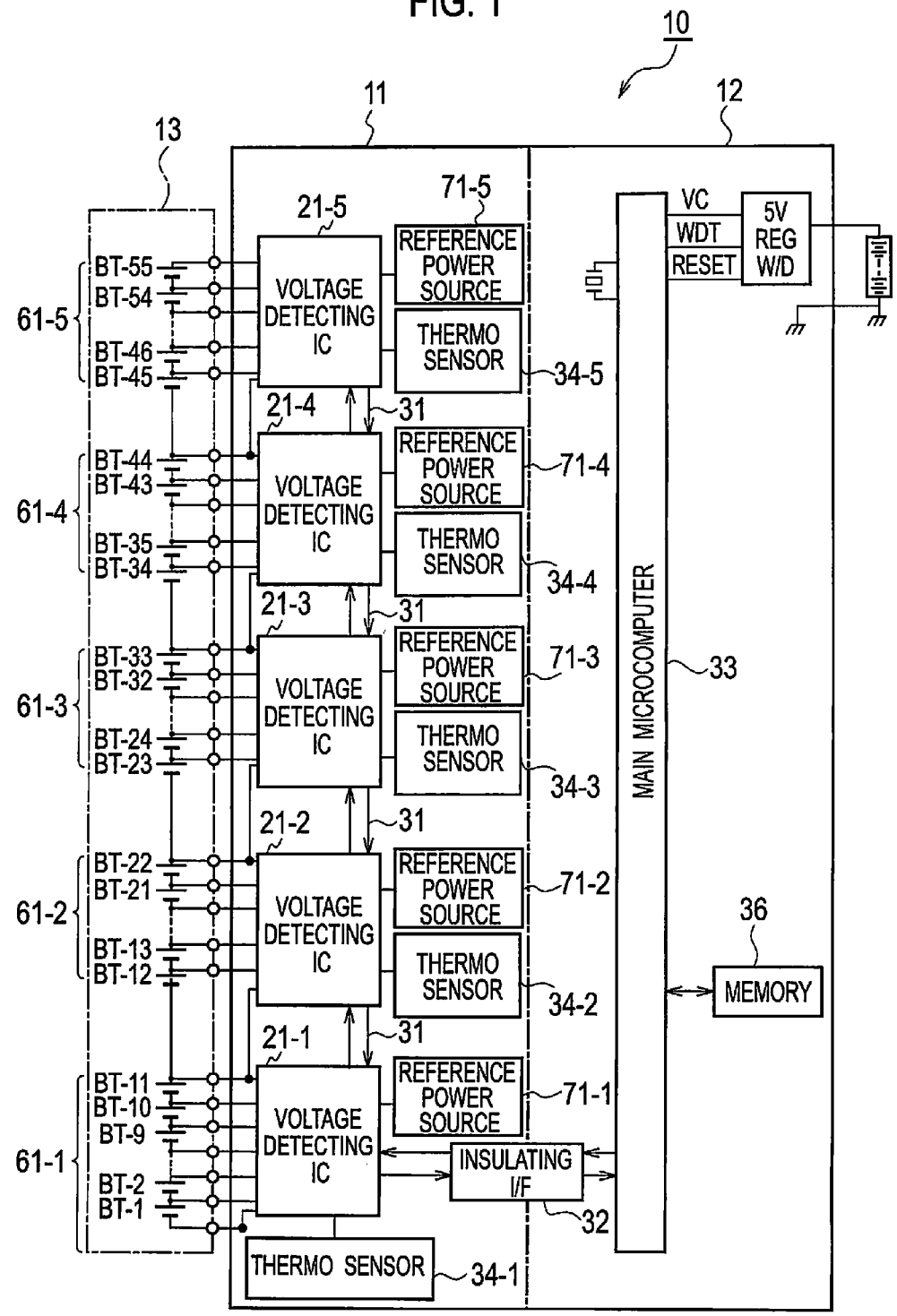
FIG. 1 is a block diagram illustrating a configuration of a voltage measuring apparatus for a plural battery according to an embodiment of the present invention.
Figure 2:
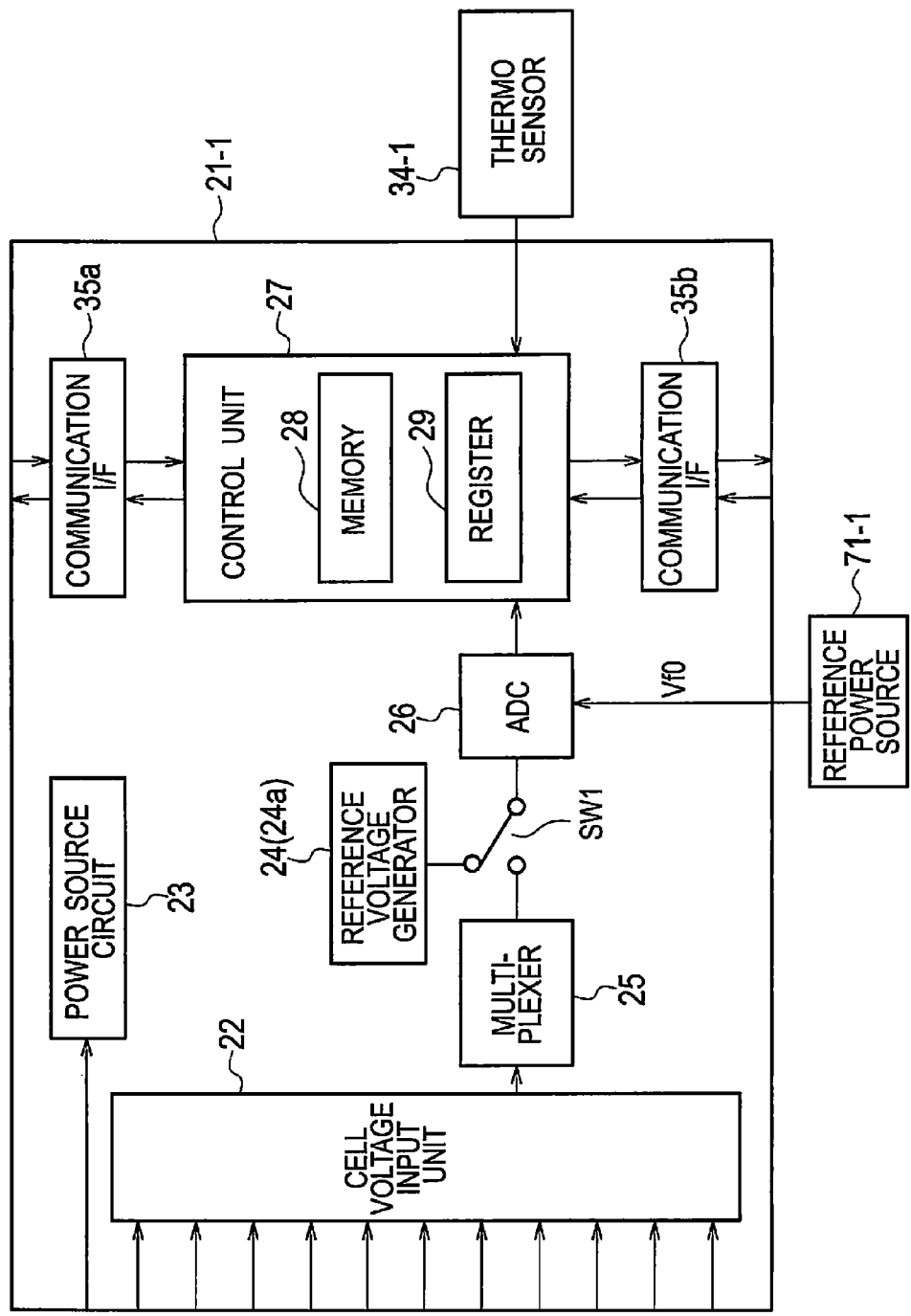
FIG. 2 is a block diagram illustrating a detailed configuration of a voltage detecting IC arranged in the voltage measuring apparatus for a plural battery according to the embodiment of the present invention.

An embodiment of the present invention will be explained with reference to the drawings. FIG. 1 is a block diagram illustrating a voltage measuring apparatus 10 according to the embodiment of the present invention and a secondary battery (plural battery of an assembled battery) 13 including a plurality of unit cells BT1 to BT55 and FIG. 2 is a block diagram illustrating a detailed configuration of a voltage detecting IC (21-1). The secondary battery 13 adopted by this embodiment is used as, for example, a high-voltage battery to drive a motor of an electric car, a hybrid vehicle, or the like.

As illustrated in FIG. 1, the voltage measuring apparatus 10 according to the embodiment is separated by an insulating interface 32 into a high-voltage-side apparatus 11 and a low-voltage-side apparatus 12.

The high-voltage-side apparatus 11 includes five voltage detecting ICs, i.e., the first voltage detecting IC (21-1) to the fifth voltage detecting IC (21-5). The first voltage detecting IC (21-1) measures a cell voltage of each of 11 unit cells BT1 to BT11 that are grouped into a first block (61-1). The second voltage detecting IC (21-2) measures a cell voltage of each of 11 unit cells BT12 to BT22 that are grouped into a second block (61-2). The third voltage detecting IC (21-3) measures a cell voltage of each of 11 unit cells BT23 to BT33 that are grouped into a third block (61-3). The fourth voltage detecting IC (21-4) measures a cell voltage of each of 11 unit cells BT34 to BT44 that are grouped into a fourth block (61-4). The fifth voltage detecting IC (21-5) measures a cell voltage of each of 11 unit cells BT45 to BT55 that are grouped into a fifth block (61-5).

Each of the voltage detecting ICs (21-1) to (21-5) has an A/D converter (A/D conversion part) 26 (refer to FIG. 2) that uses an A/D converting voltage Vf0 provided by a corresponding one of reference voltage sources (71-1) to (71-5) to convert cell voltages (an analog voltage signal) of a corresponding block (one of the first to fifth blocks) into a digital voltage signal.

The voltage detecting ICs (21-1) to (21-5) are connected to thermo sensors (temperature detectors) (34-1) to (34-5), respectively, to detect an ambient temperature.

With reference to FIG. 2, the voltage detecting ICs (21-1) to (21-5) will be explained. The second to fifth voltage detecting ICs (21-2) to (21-5) have the same configuration as the first voltage detecting IC (21-1), and therefore, the first voltage detecting IC (21-1) will be explained as an example.

As illustrated in FIG. 2, the first voltage detecting IC (21-1) includes a power source circuit 23 that receives power from the unit cells and generates a predetermined voltage, an input part of cell voltage 22 that is connected to the unit cells BT1 to BT11 of the first block (61-1) to detect output power of these unit cells, a multiplexer 25 that converts voltage signals of the unit cells outputted from the input part of cell voltage 22 into a time-series signal, and a reference voltage generator 24 that generates a reference voltage.

Further included are the A/D converter 26 that converts the voltage signal of the unit cells BT1 to BT11 outputted from the multiplexer 25 and the voltage signal outputted from the reference voltage generator 24 each into a digital signal and a switch SW1 that selects one of the output signals of the multiplexer 25 and reference voltage generator 24 and supplies the selected one to the A/D converter 26.

The A/D converter 26 digitizes the analog voltage signal according to the A/D conversion voltage Vf0 outputted from the reference power source (71-1).

The first voltage detecting IC (21-1) also includes a control part 27 and two communication I/Fs (communication part) 35a and 35b. The control part 27 carries out a process of transmitting the digital voltage signal from the A/D converter 26 through the communication I/Fs 35a and 35b to a main microcomputer 33 illustrated in FIG. 1.

The switch SW1 operates under the control of the control part 27 and is connected to the multiplexer 25 in a normal state and to the reference voltage generator 24 in a case of calibrating the accuracy of voltage detection such as initializing the apparatus for shipment.

The second to fifth voltage detecting ICs (21-2) to (21-5) are connected through a communication line 31 to the first voltage detecting IC (21-1) and the voltage detecting IC (21-1) is connected through the insulating interface 32 to the main microcomputer 33 arranged in the low-voltage-side apparatus 12. Namely, the main microcomputer 33 and voltage detecting ICs (21-1) to (21-5) are connected through the insulating interface 32 to each other to realize daisy-chain communication.

As illustrated in FIG. 1, the main microcomputer 33 is connected through the insulating I/F 32 to the first voltage detecting IC (21-1), to issue a voltage detecting instruction and voltage calibrating process instruction to the voltage detecting ICs (21-1) to (21-5), receive voltage signals from the voltage detecting ICs (21-1) to (21-5), read the voltages of the unit cells BT1 to BT55, and transmit them to a higher system (not illustrated). Namely, the main microcomputer 33 functions as a charging state monitoring part to monitor a charging state of each cell voltage according to the cell voltages detected by the voltage detecting ICs (21-1) to (21-5). The main microcomputer 33 is also connected to a memory 36.

Figure 3:
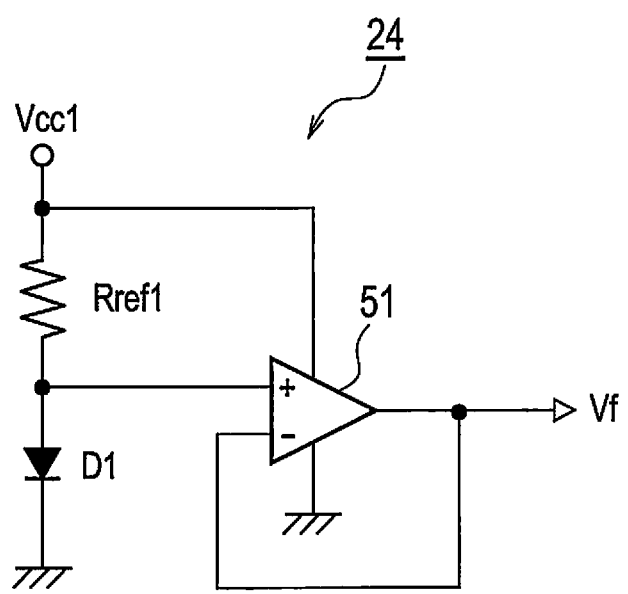
FIG. 3 is a circuit diagram illustrating a reference voltage generator arranged in the voltage measuring apparatus for a plural battery according to the embodiment of the present invention.

FIG. 3 is a circuit diagram illustrating a detailed configuration of the reference voltage generator 24. As illustrated, the reference voltage generator 24 has a series-connected circuit including a resistor (resistance body) Rref1 and a diode D1. One end of the resistor Rref1 is connected to a supply point of a power source Vcc1 and one end of the diode D1 is grounded. A connection point of the resistor Rref1 and diode D1 is connected to a buffer amplifier 51. Accordingly, a voltage generated at an output terminal of the buffer amplifier 51 is a voltage obtained by stabilizing a voltage across the diode D1. This voltage serves as a reference voltage Vf.

The memory 36 connected to the main microcomputer 33 stores theoretical value data of the reference voltage Vf related to ambient temperatures. Namely, a voltage to be generated across the diode D1 illustrated in FIG. 3 is provided as a function of an ambient temperature. If an ambient temperature is determined, a voltage to be generated across the diode D1 is uniquely determined, and therefore, the memory 36 stores a temperature-theoretical value correspondence table indicating correspondence between ambient temperatures and theoretical values of the reference voltage Vf. Namely, the memory 36 functions as a theoretical value generating part that provides a theoretical value of the voltage generated across the diode D1 with respect to an ambient temperature.

Further, the main microcomputer 33 compares an actually measured value of the reference voltage Vf detected by each of the voltage detecting ICs (21-1) to (21-5) with the theoretical value and finds an error in the voltage signal digitized by the A/D converter 26. Namely, the main microcomputer 33 functions as an error detecting means that compares a digitized voltage signal of the reference voltage with a theoretical value, and according to a result of the comparison, detects an error in the voltage signal digitized by the A/D conversion means.

Operation of the voltage measuring apparatus 10 according to the embodiment of the present invention with the above-mentioned configuration will be explained.

Normally, the switch SW1 in each of the voltage detecting ICs (21-1) to (21-5) illustrated in FIG. 2 is connected to the multiplexer 25. Accordingly, cell voltages of the unit cells BT-1 to BT-11 connected to the first voltage detecting IC (21-1) are converted by the multiplexer 25 into a serial signal, which is digitized by the A/D converter 26. The digitized voltage signal is transmitted through the communication I/Fs 35a and 35b to the main microcomputer 33. The main microcomputer 33, therefore, obtains the cell voltages of the unit cells BT-1 to BT-55 and monitors whether or not the unit cells BT-1 to BT-55 cause overdischarge or overcharge.

Figure 4:
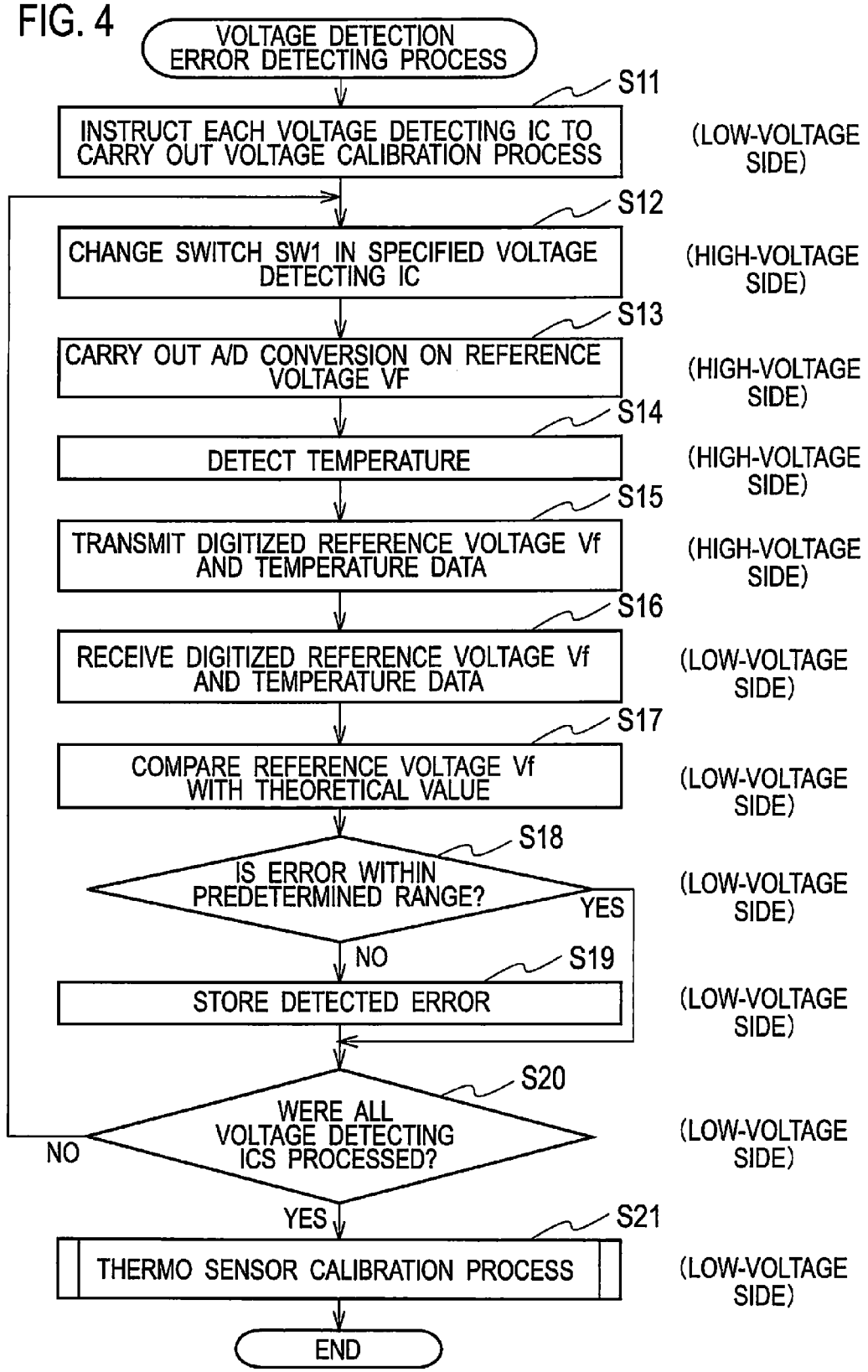
FIG. 4 is a flowchart illustrating a processing operation of the voltage measuring apparatus for a plural battery according to the embodiment of the present invention.

An error detecting process of voltage detection carried out by the voltage measuring apparatus 10 according to the embodiment of the present invention will be explained with reference to the flowchart illustrated in FIG. 4.

First, the main microcomputer 33 transmits a signal of instructing a voltage calibration process to the voltage detecting ICs (21-1) to (21-5) (step S11).

According to the instruction of the main microcomputer 33, the control part 27 of the first voltage detecting IC (21-1) changes the switch SW1 to the reference voltage generator 24 (step S12). As a result, a reference voltage outputted from the reference voltage generator 24, i.e., the reference voltage Vf outputted from the buffer amplifier 51 of the circuit illustrated in FIG. 3 is outputted to the A/D converter 26.

The A/D converter 26 digitizes the reference voltage Vf outputted from the reference voltage generator 24 (step S13). The thermo sensor (34-1) detects an ambient temperature of the first voltage detecting IC (21-1) (step S14).

The communication I/Fs 35a and 35b transmit, through the insulating I/F 32, the digitized reference voltage Vf and the temperature data detected by the thermo sensor (34-1) to the main microcomputer 33 in the low-voltage-side apparatus 12 (step S15).

The main microcomputer 33 receives the reference voltage Vf and temperature data transmitted from the first voltage detecting IC (21-1). The main microcomputer 33 refers to the temperature-theoretical value correspondence table stored in the memory 36 and finds a theoretical value for the reference voltage Vf according to the temperature data. Namely, a voltage to be generated across the diode D1 illustrated in FIG. 3 is a function of a temperature, and the voltage is determined as the temperature is determined. This voltage is provided as the theoretical value. This theoretical value is compared with the measured reference voltage Vf transmitted from the voltage detecting IC (21-1) (step S17).

Thereafter, an error between the theoretical value and the measured value is computed and it is determined whether or not the error is within a predetermined range (step S18). If it is determined that the error is not within the predetermined range (the error is large) (NO in step S18), the error is stored in the memory 36 (step S19). If the error is within the predetermined range (the error is small) (YES in step S18), the detected error is not stored.

The main microcomputer 33 sequentially processes the voltage detecting ICs (21-2) to (21-5) (step S20), and if all of the voltage detecting ICs (21-1) to (21-5) are processed, carries out a calibration process of the thermo sensors (34-1) to (34-5) (step S21). The details of the temperature calibration process will be explained later.

In connection with any one of the measured reference voltages Vf detected by the voltage detecting ICs (21-1) to (21-5) that involves a large error with respect to the theoretical value, the detected cell voltages are corrected according to the error between the theoretical value and the measured value. As a result, even if the voltage detecting ICs (21-1) to (21-5) deteriorate their voltage detecting accuracy, detection errors are highly accurately correctable.

Figure 5:
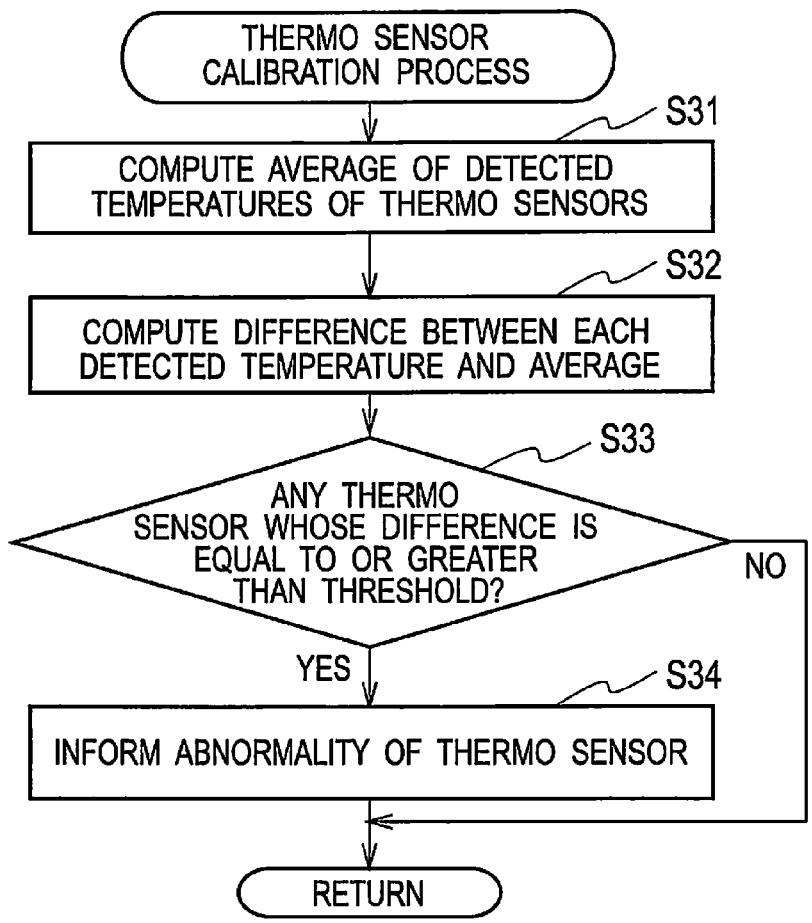
FIG. 5 is a flowchart illustrating a processing operation of the voltage measuring apparatus for a plural battery according to the embodiment of the present invention.

The calibration process of the thermo sensors in step S21 of FIG. 4 will be explained with reference to the flowchart illustrated in FIG. 5.

First, the main microcomputer 33 computes an average of the temperature data detected by the thermo sensors (34-1) to (34-5) of the voltage detecting ICs (21-1) to (21-5) (step S31).

The main microcomputer 33 computes a difference (deviation) between each piece of the temperature data detected by the thermo sensors (34-1) to (34-5) and the average (step S32).

Thereafter, it is determined whether or not the computed difference is equal to or greater than a threshold (step S33), and if there is a thermo sensor whose difference value is equal to or greater than the threshold (YES in step S33), it is determined that the thermo sensor is abnormal and the abnormality occurrence is informed with an alarm or the like (step S34).

Since the voltage detecting ICs (21-1) to (21-5) are placed in substantially the same environment, it is understood that there is no significant difference among the temperatures detected by the thermo sensors (34-1) to (34-5). If there is a large difference with respect to the average, the thermo sensor in question is considered to be abnormal and the abnormality occurrence is informed. In this way, if the thermo sensors (34-1) to (34-5) cause an abnormality, it is detected and is informed to an operator.

In this way, the voltage measuring apparatus 10 according to the embodiment arranges the reference voltage generator 24 in each of the voltage detecting ICs (21-1) to (21-5) and compares a measured reference voltage Vf outputted from the reference voltage generator 24 with a theoretical value, thereby determining the voltage detection accuracy of each of the voltage detecting ICs (21-1) to (21-5).

The reference voltage generator 24 has the series-connected circuit including the diode D1 and resistor Rref1 as illustrated in FIG. 3. A measured value of the voltage (reference voltage Vf) that is generated across the diode D1 when the voltage Vcc1 is applied across the series-connected circuit is compared with a theoretical value obtained according to temperature data detected by a corresponding one of the thermo sensors (34-1) to (34-5). According to the size of an error found through the comparison, it is determined whether or not the voltage measurement accuracy is good. In this way, a detection error of the voltage detecting ICs (21-1) to (21-5) is correctly detected.

In addition, the detection error is used to correct each cell voltage so that the voltage detecting ICs (21-1) to (21-5) may provide precise cell voltages.

If the thermo sensors (34-1) to (34-5) cause an abnormality, the abnormality is detected and is informed to an operator so that the abnormal thermo sensor may quickly be recognized and dealt with.

Figure 6:
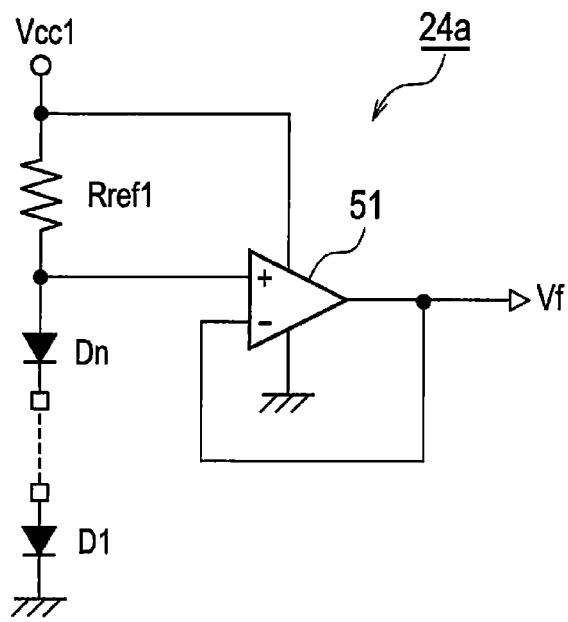
FIG. 6 is a circuit diagram illustrating a reference voltage generator arranged in the voltage measuring apparatus for a plural battery according to the embodiment of the present invention.

A modification of the embodiment mentioned above will be explained. FIG. 6 is a circuit diagram illustrating a reference voltage generator 24a according to the modification. As illustrated, this reference voltage generator 24a differs from the reference voltage generator 24 illustrated in FIG. 3 in that a plurality of (n pieces) diodes are connected in series. Namely, the n diodes D1 to Dn are arranged between a resistor Rref1 and the ground. A connection point of the diode Dn and resistor Rref1 is connected to a buffer amplifier 51 and one end of the diode D1 is grounded. An output voltage of the buffer amplifier 51 is the reference voltage Vf.

With this configuration, the reference voltage Vf can be set to a required value. For example, one diode may generate a voltage of about 0.6 V. Then, six diodes may be connected to provide a voltage of about 3.6 V. If a cell voltage is, for example, 4 V, a voltage close to this voltage may be set as the reference voltage Vf. This results in further improving the accuracy of voltage calibration.

Although the voltage measuring apparatus of the present invention has been explained with reference to the embodiment illustrated in the drawings, the present invention is not limited to the embodiment. Configurations of the individual parts are replaceable with optional configurations if they provide the same or similar functions.

For example, the above-mentioned embodiment employs the diode D1 for the reference voltage generator 24. Instead, a base-emitter portion of a transistor may be employed. It is possible to employ a Zener diode instead of the diode D1 to generate a constant voltage.

According to the embodiment mentioned above, the memory 36 connected to the main microcomputer 33 stores the temperature-voltage table, which is used to find a theoretical value of voltage. Instead, the theoretical value may be computed according to an ambient temperature. It is known that a silicon semiconductor has a temperature characteristic of −2 [mV/° C.] with respect to a voltage at t° C. This temperature characteristic may be used to find a theoretical value of voltage. Namely, the theoretical value generating part of the present invention may find a theoretical voltage value according to any one of the technique of using a table and the technique of using computation.

According to the present invention, the voltage measuring apparatus for a plural battery includes the voltage detecting parts in each of which the reference voltage generator outputs a reference voltage. The reference voltage is A/D-converted and the digitized voltage signal is transmitted to the charging state monitoring part. The charging state monitoring part compares the digitized reference voltage (measured reference voltage) with a theoretical value obtained according to an ambient temperature, and according to a result of the comparison, determines whether or not the voltage detecting accuracy of the voltage detecting part is good. This improves the voltage detecting accuracy of each of the voltage detecting part.

The present invention is applicable to detecting deterioration in the voltage measuring accuracy of a plural battery and correcting detected voltage values.

UNITED STATES DESIGNATION

In connection with United States designation, this international patent application claims the benefit of priority under 35 U.S.C. 119(a) to Japanese Patent Application No. 2010-231210 filed on Oct. 14, 2010 whose disclosed contents are cited herein.

The invention claimed is:

1. A voltage measuring apparatus for measuring an output voltage of each cell of a plural battery that connects a plurality of cells in series to output a required voltage, comprising:
    a voltage detector provided for each of a plurality of blocks into which the plurality of cells are divided, configured to detect each cell voltage in the block; and
    a charging state monitoring part configured to monitor a charging state of each cell voltage according to the cell voltages detected by the voltage detectors,
    each of the voltage detectors including:
        a communication part configured to transmit and receive data to and from the charging state monitoring part;
        a reference voltage generator having a series-connected circuit of a resistor and at least one diode configured to output a reference voltage that is generated across the diode when a voltage is applied across the series-connected circuit; and
        an A/D converter configured to digitize an output voltage of each cell and the reference voltage,
    the communication part transmitting the digitized voltage signals to the charging state monitoring part,
    the charging state monitoring part including:
        a theoretical value generator configured to generate a theoretical voltage generated across the diode according to an ambient temperature; and
        an error detector configured to compare the digitized voltage signal of the reference voltage transmitted from the voltage detector with the theoretical value, and according to a result of the comparison, detect an error in the voltage signals digitized by the A/D converter.

2. The voltage measuring apparatus for a plural battery according to claim 1, wherein
    the charging state monitoring part corrects the output voltage signal of each cell according to the error detected by the error detector.

3. The voltage measuring apparatus for a plural battery according to claim 1, wherein:
    each of the voltage detectors has a temperature detector to detect an ambient temperature of the voltage detector and the communication part transmits the ambient temperature data detected by the temperature detector to the charging state monitoring part; and
    the theoretical value generator generates the theoretical value according to the ambient temperature data detected by the temperature detector.

4. The voltage measuring apparatus for a plural battery according to claim 1, wherein
    the charging state monitoring part computes an average of the temperature data detected by the temperature detectors, and determines that the temperature detector in question is abnormal if a difference between the detected temperature data and the average is greater than a predetermined threshold.

5. The voltage measuring apparatus for a plural battery according to claim 1, wherein
    the theoretical value generator includes a map indicating a relationship between an ambient temperature and a voltage generated across the diode.

6. The voltage measuring apparatus for a plural battery according to claim 1, wherein
    the voltage detectors are arranged in a high-voltage-side circuit and the charging state monitoring part is arranged in a low-voltage-side circuit that is connected through an insulating interface to the high-voltage-side circuit.

* * * * *